United States Patent [19]
Epworth et al.

[11] Patent Number: 6,130,899
[45] Date of Patent: Oct. 10, 2000

[54] LASER ASSEMBLY

[75] Inventors: Richard Edward Epworth, Sawbridgeworth; Jonathan Paul King, Epping, both of United Kingdom

[73] Assignee: Nortel Networks Corporation, Montreal, Canada

[21] Appl. No.: 08/764,422

[22] Filed: Dec. 12, 1996

[51] Int. Cl.$^7$ .................................. H01S 3/09; H01S 3/23
[52] U.S. Cl. .................................. 372/6; 372/75; 372/97; 372/102; 359/341; 359/342
[58] Field of Search ..................... 372/6, 96, 97, 372/99, 102, 98, 75, 32, 29, 20; 359/341, 124, 130, 342, 344; 385/24, 37

[56] References Cited

U.S. PATENT DOCUMENTS

| | | | |
|---|---|---|---|
| 4,923,270 | 5/1990 | Carter | 372/50 |
| 5,052,013 | 9/1991 | Putnam | 372/97 |
| 5,163,058 | 11/1992 | Farries et al. | 372/6 |
| 5,589,684 | 12/1996 | Ventrudo et al. | 372/102 |
| 5,636,309 | 6/1997 | Henry et al. | 385/129 |
| 5,761,234 | 6/1998 | Craig et al. | 372/75 |

FOREIGN PATENT DOCUMENTS

| | | |
|---|---|---|
| 0 459 650 | 12/1991 | European Pat. Off. . |
| 0 704 949 | 4/1996 | European Pat. Off. . |
| 6-2229105 | 10/1987 | Japan . |
| 6-2229891 | 10/1987 | Japan . |
| 2 293 684 | 3/1996 | United Kingdom . |

OTHER PUBLICATIONS

Agrawal, "Fibre–optic communication systems", 1992, pp. 284–285.

Young, "A 16×1 Wavelength Division Multiplexer with Integrated . . . ", IEEE Photonics Technology Letters, vol. 5, No. 8, Aug. 1, 1993, pp. 908–910.

Zirngible, "An 18–Channel Multifrequency Laser", IEEE Photonics Technology Letters, vol. 8, No. 7, Jul. 1, 1996, pp. 870–872.

Giles, "Simultaneous Wavelength—Stabilization of 980—nm Pump Lasers", IEEE Photonics Technology Letters, vol. 6, No. 8, Aug. 1994, pp. 907–909.

Tachikawa, "32 Wavelength tunable arrayed—waveguide grating . . . ", Electronics Letters, vol. 31, No. 19, Sep. 14, 1995, pp. 1665–1666.

Dianov, "Injection Laser With Integrated March—Zehnder cavity", Conference on Optical Communication, Sep. 27, 1992, vol. 1, No. 18, pp. 189–192.

*Primary Examiner*—Hemang Sanghavi
*Attorney, Agent, or Firm*—Lee, Mann, Smith, McWilliams, Sweeney & Ohlson

[57] ABSTRACT

One facet of each of a set of N semiconductor laser chips is provided with an antireflection coating through which the chip emission is coupled, via a wavelength multiplexer, with a partially reflecting Bragg reflector providing an N-way wavelength multiplexed laser output for pumping an optical amplifier. The wavelength multiplexer may be constituted by a cascade arrangement of Mach-Zehnders.

6 Claims, 4 Drawing Sheets

LASER ASSEMBLY

BACKGROUND TO THE INVENTION

This invention relates to laser assemblies with common outputs. A particular though not necessarily exclusive application for such devices is for optically pumping optical amplifiers.

In the field of optically pumped optical amplifiers the optical wavelength multiplexing of pump sources has been proposed as a way of increasing pump power in a single spatial mode. All the different pump wavelengths need to be confined within the appropriate absorption spectrum of the optical amplifier, and also involves the emission wavelength of the individual pumps being spectrally aligned with the spectral characteristics of the wavelength multiplexer. Typically this requires active wavelength control using feedback electro-optic control loops to achieve the requisite spectral precision. Such feedback is for instance employed in the wavelength multiplexed optical amplifier pump described in UK Patent Application GB 2 293 684.

SUMMARY OF THE INVENTION

The present invention is directed to an alternative way of obtaining the requisite spectral precision that is advantageous in that it is all-optical rather than electro-optical.

According to the present invention there is a provided a laser assembly having a set of N reflectors optically coupled via a set of N optical amplifiers and an N×1 wavelength multiplexer with a partially reflecting common reflector so as to define N laser cavities providing an N-way wavelength-multiplexed output from the common reflector.

Preferably the N optical amplifiers are semiconductor chips each provided with an antireflection coated facet at one end of the chip and a reflecting facet at the other. A feature of the invention is that multiple wavelength operation is possible without the imposition of the requirement that each of the N chips be different from each of the other N−1 chips. They may be all identical, and can be constructed in monolithic form.

It is also an object of the present invention to provide, for an optical transmission system, an optically pumped optical amplifiers in which increased pump power is provided by wavelength multiplexing into a single optical mode a plurality of closely wavelength spaced optical sources in a manner that avoids the need either for tight wavelength tolerancing of the individual sources, or for active electro-optical feedback wavelength control of these sources.

The invention also provides an optical amplifier optically pumped by a laser assembly having a set of N reflectors optically coupled via a set of N optical amplifiers and an N×1 wavelength multiplexer with a partially reflecting common reflector so as to define N laser cavities providing an N-way wavelength-multiplexed output from the common reflector.

One preferred form of wavelength multiplexer for the laser assembly is a Mach-Zehnder, or tree of Mach-Zehnders. Another preferred form employs, in place of one or more Mach-Zehnders, a polarisation beam splitter in association with two wavelength-dependent birefringent elements such as Lyot depolarisers.

The invention further provides, in an optically pumped optical amplifier having a set of N optical pump amplifier sources provided with optical feedback to make the sources lase, a method of controlling the wavelength relationship between the emission wavelengths of the N lasing optical pump sources by providing the feedback in part by a partial reflector that is common to each lasing source via an N×1 wavelength multiplexing element to provide a combined wavelength multiplexed optical pump output from the partial reflector.

BRIEF DESCRIPTION OF THE DRAWINGS

There follows a description of laser assemblies embodying the invention in preferred forms. The description refers to the accompanying drawings in which.

DETAILED DESCRIPTION OF PREFERRED EMBODIMENTS

Figure 1:
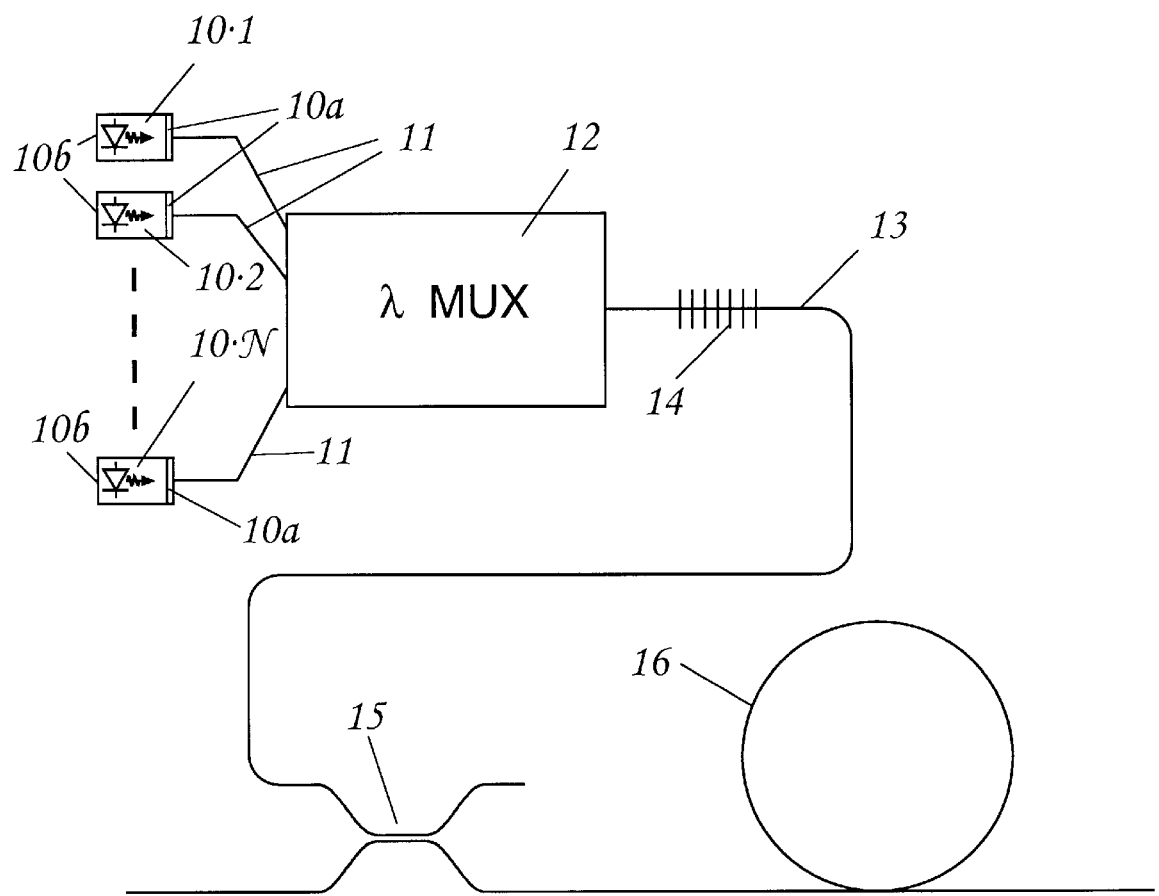
FIG. 1 depicts a schematic diagram of a laser assembly constituting the pump of an optically pumped fiber amplifier, FIG. 2 schematically depicts an embodiment of the laser assembly of FIG. 1 employing a single Mach Zehnder as its wavelength multiplexer.

Referring to FIG. 1, set of N semiconductor injection optical amplifier chips 10.1, 10.2 . . . 10.N are each provided with an anti-reflection coating 10a at the end opposite a reflecting facet 10b. The individual amplifier chips 10 are represented as fully discrete chips but may alternatively be constituted by different parts of a monolithic structure.

Each amplifier 10 is optically coupled via its anti-reflection coated facet 10a with an associated single mode optical fiber pigtail 11. The other ends of the fiber pigtails 11 are optically coupled with the N ports of an N×1 wavelength multiplexer 12. A further length 13 of single mode optical fiber is connected to the remaining part of the multiplexer 12, and in the fiber is formed a partially reflecting Bragg reflective grating 14. The optimum reflectivity needs to be less than 100% to allow light to emerge from the optical cavity through this reflector, but the reflectivity should be high enough to dominate the feedback. The other end of the fiber 13 is connected to one input of a pump/signal wavelength-multiplexing coupler 15. Signal traffic is applied to the other input port, and the multiplexed output appears at one of its output ports, to which is connected a length 16 of optically amplifying fiber.

The Bragg reflective grating 14 co-operates, via the multiplexer 12, with the reflecting facets 10b of the semiconductor optical amplifiers 10 to form N laser cavities sharing a common optical cavity defining reflector, grating 14, in such a way as to provide a multiplexed output from the common reflector directed towards the wavelength-multiplexing coupler 15.

Figure 2:
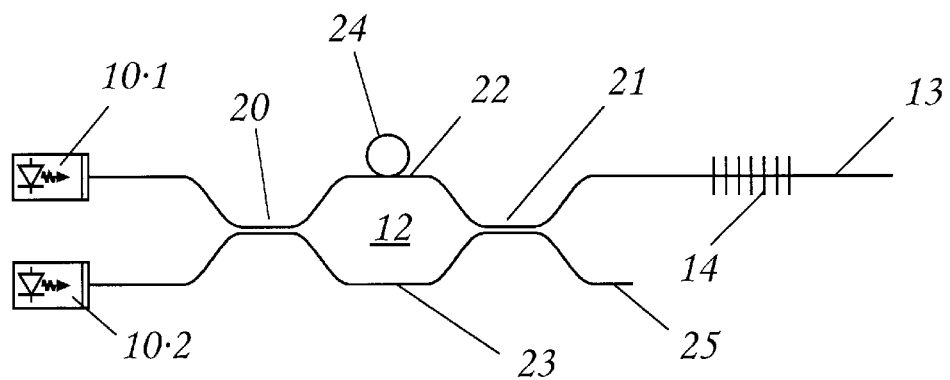

An example of a laser assembly composed of two lasers wavelength multiplexed by a Mach-Zehnder is depicted in FIG. 2. The Mach-Zehnder 12 of the assembly of FIG. 2 is constituted by a tandem arrangement of two single mode fused fiber 4-port 3 dB couplers 20 and 21 coupled by two unequal lengths 22 and 23 of single mode fiber. The difference in their lengths is represented by the small loop 24.

Figure 3:
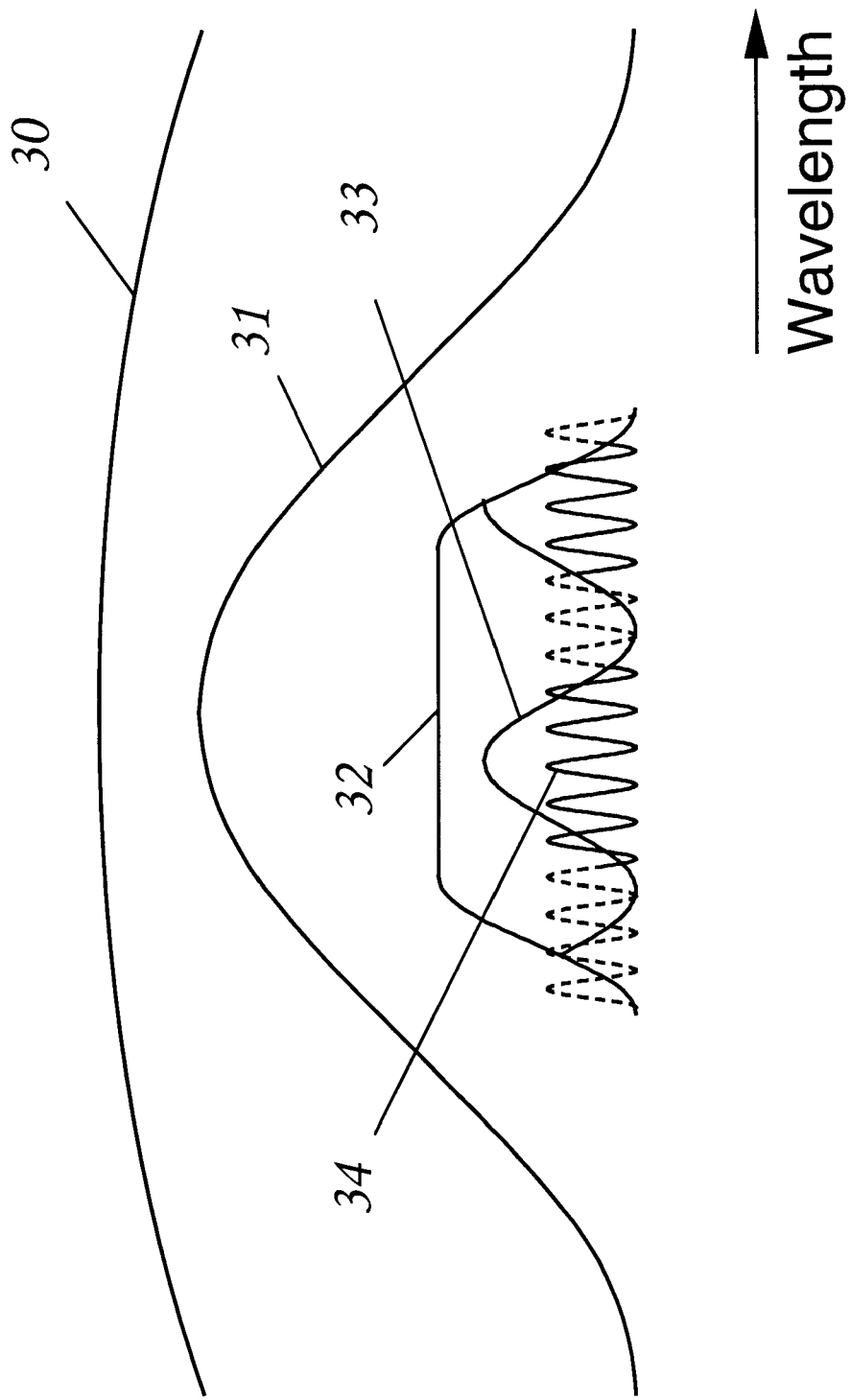
FIG. 3 depicts a preferred arrangement of wavelength dependencies for the laser assembly of FIG. 2, FIG. 4 schematically depicts an embodiment of the laser assembly of FIG. 1 employing a tree of three Mach-Zehnders as its wavelength multiplexer, and FIG. 5 schematically depicts an embodiment of the laser assembly of FIG. 1 employing a tree of three polarisation beam splitters with four associated wavelength-dependent birefringent elements as its wavelength multiplexer.

FIG. 3 depicts the way the spectral characteristics of the individual components of the laser assembly of FIG. 2 are nested. Curve 30 depicts the gain spectrum of the semiconductor amplifier clips 10. This is the characteristic with the widest spectral width. Next smaller is the width of the absorption characteristic 31 of the optical amplifier fiber 16. Slightly smaller still is the spectral reflection characteristic 32 of the Bragg reflector 14. This is a non-saturating characteristic (i.e. the peak reflective coefficient is less than 100%), but it should have a relatively flat-topped reflective band with relatively fast roll-off both at the short- and long-wavelength edges of the reflective band. The Bragg reflector spectral characteristic lies entirely within the range of the absorption characteristic of the amplifier fiber 16. The absorption characteristic of the amplifier must overlap, and preferably lies entirely within, the gain spectrum 30 of the semiconductor chips 10.

The difference in optical path length between the two limbs 22 and 23 of the Mach-Zehnder is chosen to provide a substantially raised cosine spectral characteristic 33 that includes at least one peak and at least one trough within the spectral range defined by the flat topped portion of the spectral reflective characteristic of the Bragg reflector 14. In fact the Mach-Zehnder will have two characteristics (one for the straight through path, and the other for the cross-over path) with the troughs of one registering with the crests of the other. For reasons of clarity the second characteristic has been omitted from FIG. 3. Finally there will be a substantially raised cosine spectral characteristic 34 for each of the composite laser cavities that are respectively defined between the Bragg reflector 14 and the reflecting facet 10b of each of the semiconductor amplifier chips 10. To ensure that each of the N optical cavities is capable of lasing, the optical path length from each reflecting facet 10b to the Bragg reflector 14 needs to be long enough to ensure that the characteristic 34 includes several peaks and troughs within the spectral range of a single peak of the Mach-Zehnder characteristic 33. Together, those conditions ensure that there is always at least one Fabry Pérot mode inside the channel bandwidth defined by the Mach-Zehnder multiplexer, that there will be a gain peak inside the Bragg reflector bandwidth regardless of the precise value of phase imbalance provided by the Mach-Zehnder, and, provided that the Bragg reflector bandwidth is coextensive with or lies within the absorption band of the fiber amplifier, that lasing can occur at any point in the spectrum across the full bandwidth of the Bragg reflector. A further desirable design criterion is that, in order to preclude the possibility of amplifier gain modulation being produced from inter-mode beating effects the frequency spacing of the Fabry Pérot modes, as determined by the external path distance between reflecting facet 10b and Bragg grating 14, is large compared with the reciprocal of the gain time constant of the amplifier 16.

If the antireflective coatings 10a are noticeably far from ideal, then there will be another frequency dependent element in the composite cavity, this resulting from the Fabry Pérot modes as determined by the optical path length between the ends of the semiconductor amplifier chip 10. In this instance two other desiderata come into play. First the Bragg reflector bandwidth should be larger than the mode spacing of the Fabry Pérot modes of the chip in order to ensure that there is at least one Fabry Pérot mode of the chip within the spectral band of the Bragg reflector 14. Second the bandwidth of a Fabry Pérot mode of the chip must be large compared with the bandwidth of a channel defined by the multiplexer so as to ensure that there is a lasing mode at all times.

With the foregoing criteria in mind, a typical example of an assembly as depicted in FIGS. 1 and 2 may have semiconductor chips 10 individually emitting over a gain-providing bandwidth in excess of 20 nm pumping, an erbium fiber amplifier 16 with an optical path difference providing a channel spacing of about 10 GHz, semiconductor chips of a length providing Fabry Pérot modes with a bandwidth of about 0.75 nm, and an optical path distance between reflecting facets 10b and the Bragg reflector 14 providing composite cavity Fabry Pérot modes at intervals of about 40 MHz.

Light of some arbitrary wavelength emitted by semiconductor chip 10.1 into Mach-Zehnder 12 will be divided by the Mach-Zehnder into two portions, one propagating in fiber 13 and the other propagating in the unused port of the Mach-Zehnder, port 25. As the wavelength of emission is progressively changed, the proportion launched into the unused port 25 is swept repetitively between 0 and 100%. The spectral cavity that includes semiconductor chip 10.1 will lase at a wavelength for which the round trip losses of the cavity are at a minimum. This is a wavelength for which no light from chip 10.1 is launched into the unused port 25 of the Mach-Zehnder. A similar situation holds in respect of semiconductor chip 10.2 but, since the zero power launch into unused port 25 is a straight-through condition of the Mach-Zehnder for one laser cavity and a cross-over condition for the other, it is clear that the two cavities can not lase at the same wavelength.

Figure 4:
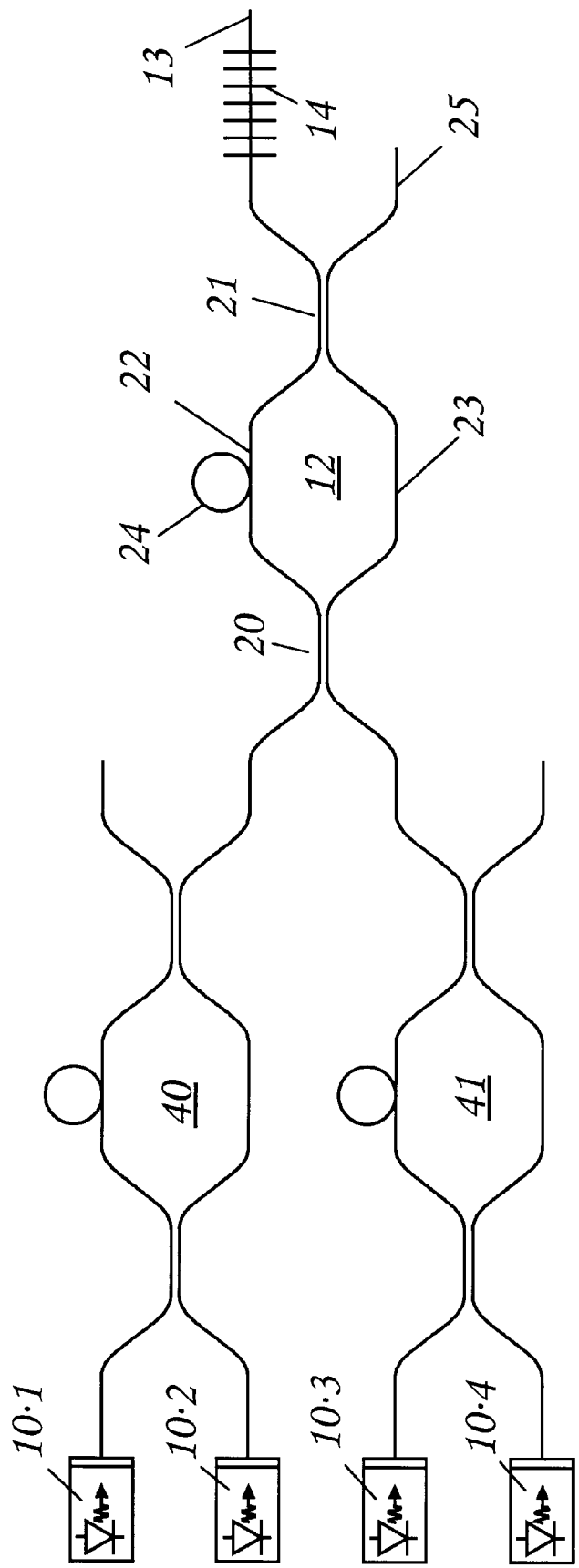

Attention is now turned to FIG. 4 which schematically depicts an assembly constructed according to the same principles described above in relation to the construction of the assembly of FIG. 2, the assembly of FIG. 4 having an extra stage of Mach-Zehnder multiplexers. The components additional to those of the assembly of FIG. 2 comprise two semiconductor optical amplifier chips 10.3, 10.4, and two further Mach-Zehnders 40, 41. The optical path difference of Mach-Zehnder 40 does not have to equal that of Mach-Zehnder 41 but, to ensure that there is a lasing frequency for each of the four chips 10.1 to 10.4 regardless of the phase difference provided by each of the three Mach-Zehnder, there should be a factor of at least two between the magnitude of the path difference of Mach-Zehnder 12 and that of each of the Mach-Zehnders 40, 41. The widest Mach-Zehnder mode spacing, as determined by the Mach-Zehnder with the smallest optical path difference, should still be smaller than the reflective bandwidth of the Bragg reflector. Similarly the narrowest Mach-Zehnder mode spacing, as determined by the Mach-Zehnder with the greatest optical path difference, should still be greater than the spacing of the Fabry Pérot modes defined between reflecting facets of the chips and the Bragg reflector so as to ensure that there is always an available lasing mode for each chip inside the wavelength range defined by that Bragg reflector.

Figure 5:
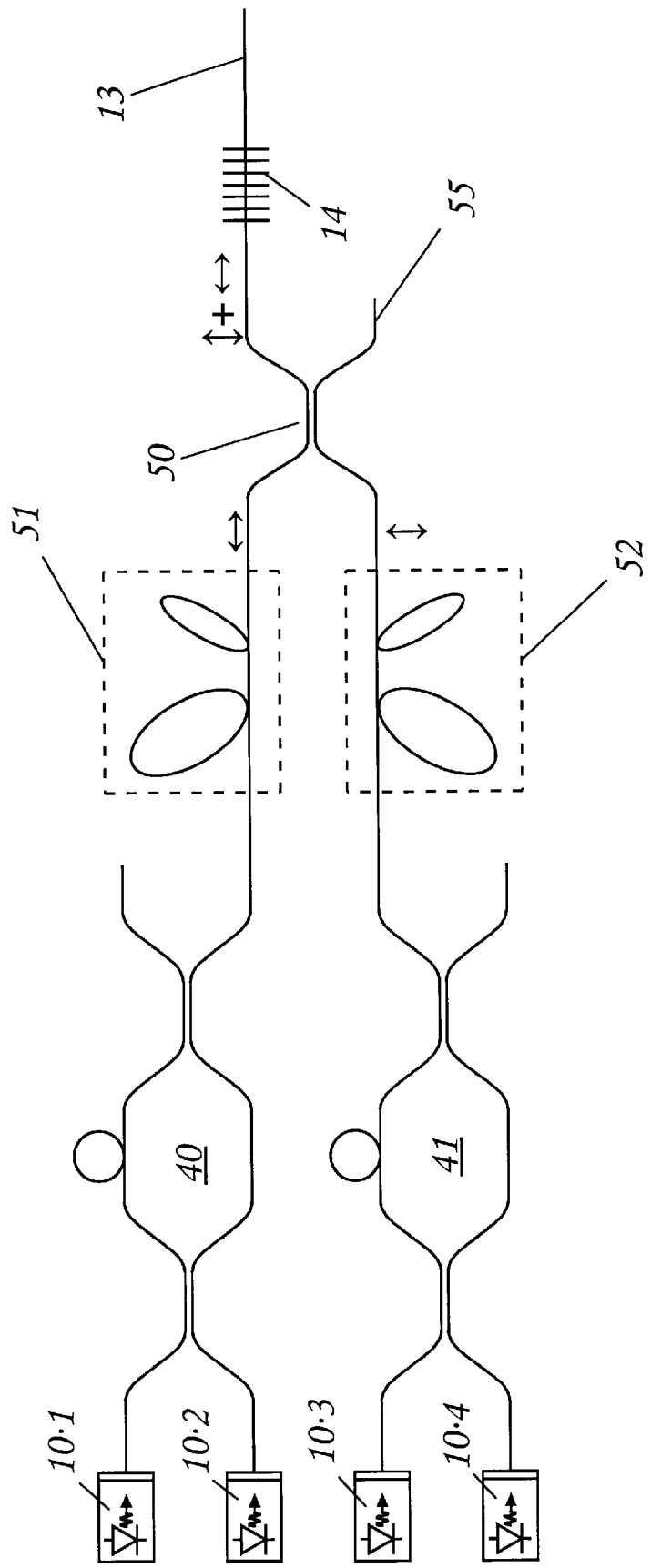

FIG. 5 shows how, by the addition of two further amplifier chips 10.3 and 10.4, two further polarisation beam-splitters 60, 61 and four further wavelength dependent birefringent elements 62, 63, 64 and 65, the twin laser assembly of FIG. 5 can be adapted to form a cascaded four laser assembly in the same manner as the twin laser assembly of FIG. 2 was cascaded to form the four laser assembly of FIG. 4. Equivalent wavelength range relationships apply.

What is claimed is:

1. An optical amplifier optically pumped by a laser assembly having a set of N reflectors optically coupled via a set of N optical amplifier sources and an N×1 wavelength multiplexer with a partially reflecting common reflector so as to define N laser cavities providing an N-way wavelength-multiplexed output from the common reflector, wherein the laser assembly N×1 wavelength multiplexer comprises at least one Mach-Zehnder waveguide structure having interference arms of different optical path length.

2. An amplifier as claimed in claim 1, wherein the N optical amplifier sources are semiconductor amplifiers.

3. An amplifier as claimed in claim 2, wherein the optical amplifier is an erbium-doped fiber amplifier.

4. In an optically pumped optical amplifier having a set of N optical pump amplifier sources provided with optical feedback to make the sources lase, a method of controlling the wavelength relationship between the emission wavelengths of the N lasing optical pump sources by providing the feedback in part by a partial reflector that is common to each lasing source via an N×1 wavelength multiplexing element to provide a combined wavelength multiplexed optical pump output from the partial reflector, wherein the N×1 wavelength multiplexing element comprises at least one Mach Zehnder waveguide structure having interference arms of different optical path length.

5. A method as claimed in claim 4, wherein the N optical pump amplifier sources are semiconductor amplifiers.

6. A method as claimed in claim 5, wherein the optical amplifier is an erbium-doped fiber amplifier.

* * * * *